United States Patent
Hoff et al.

(10) Patent No.: US 9,281,809 B1
(45) Date of Patent: Mar. 8, 2016

(54) NONLINEAR TRANSMISSION LINE EXTRACTION SYSTEMS

(75) Inventors: Brad W. Hoff, Albuquerque, NM (US); David Michael French, Albuquerque, NM (US); Susan L. Heidger, Albuquerque, NM (US)

(73) Assignee: The UNITED STATES OF AMERICA AS REPRESENTED BY THE SECRETARY OF THE AIR FORCE, Washington, DC (US)

( * ) Notice: Subject to any disclaimer, the term of this patent is extended or adjusted under 35 U.S.C. 154(b) by 307 days.

(21) Appl. No.: 13/469,005

(22) Filed: May 10, 2012

(51) Int. Cl.
| | |
|---|---|
| *H04B 3/04* | (2006.01) |
| *H03K 5/00* | (2006.01) |
| *H03K 11/00* | (2006.01) |
| *H03K 12/00* | (2006.01) |

(52) U.S. Cl.
CPC ............... *H03K 5/00* (2013.01); *H03K 11/00* (2013.01); *H03K 12/00* (2013.01)

(58) Field of Classification Search
CPC ............ H01P 3/12; H01P 3/16; H01P 3/003; H03K 5/06; H03K 5/159; H03K 5/12; H04L 25/032127
USPC ................. 333/20, 208, 209, 210, 211, 212
See application file for complete search history.

(56) References Cited

U.S. PATENT DOCUMENTS

| | | | |
|---|---|---|---|
| 2,748,350 A * | 5/1956 | Miller | 333/113 |
| 4,367,446 A * | 1/1983 | Hall | 333/135 |
| 4,855,696 A | 8/1989 | Tan et al. | |
| 5,023,574 A | 6/1991 | Anklan et al. | |
| 5,066,928 A * | 11/1991 | Ikezi et al. | 333/20 |
| 5,157,361 A | 10/1992 | Gruchalla et al. | |
| 5,319,665 A | 6/1994 | Birx | |
| 5,410,318 A * | 4/1995 | Wong et al. | 342/359 |
| 5,804,921 A | 9/1998 | McEwan et al. | |
| 5,923,227 A | 7/1999 | Seddon | |
| 6,538,525 B1 | 3/2003 | Williamson | |
| 7,170,444 B1 | 1/2007 | Seddon et al. | |
| 7,450,059 B1 | 11/2008 | Seddon | |
| 2004/0227581 A1 | 11/2004 | Noujeim | |

(Continued)

OTHER PUBLICATIONS

Branch, G. et al "Fast-rise-time electromagnetic shock waves in nonlinear, ceramic dielectrics" Journal of Physics D, vol. 29, Issue 8, pp. 2170-2178 (1996).

(Continued)

*Primary Examiner* — Stephen E Jones
*Assistant Examiner* — Scott S Outten
(74) *Attorney, Agent, or Firm* — James M. Skorich

(57) ABSTRACT

A dielectric-based nonlinear transmission line (NLTL) coupled to an adjacent waveguide. Energy in an input pulse to the nonlinear transmission line is concentrated into an electromagnetic shock or a series of soliton-like oscillations by the nonlinear properties of the NLTL. Energy from the electromagnetic shock or the soliton-like oscillations are transferred into the waveguide. A plate of the NLTL coupled to the waveguide can include an aperture or a series of apertures. Energy from the electromagnetic shock or the soliton-like oscillations can then be transferred into waveguide via an aperture or apertures in such a way that forward and/or backward guided electromagnetic waves are generated in the waveguide. The waveguide can contain at a nonlinear magnetic material, a dielectric material, a slow wave structure, or a metamaterial. The NLTL can include nonlinear dielectric elements such as a periodic array interspersed with linear dielectric elements.

23 Claims, 6 Drawing Sheets

(56) References Cited

U.S. PATENT DOCUMENTS

2007/0152875 A1    7/2007    Seddon et al.
2009/0051468 A1    2/2009    Scott et al.
2010/0073110 A1*   3/2010    Nathan et al. ................ 333/218

OTHER PUBLICATIONS

Ikezi, H. et al, "Solution Generation at 10 MW Level in the Very High Frequency Band", Applied Physics Letters 58, pp. 986-987 (1991).

\* cited by examiner

NONLINEAR TRANSMISSION LINE EXTRACTION SYSTEMS

STATEMENT OF GOVERNMENT INTEREST

The conditions under which this invention was made are such as to entitle the Government of the United States under paragraph I(a) of Executive Order 10096, as represented by the Secretary of the Air Force, to the entire right, title and interest therein, including foreign rights.

FIELD OF THE INVENTION

The present invention generally related to the extraction of electromagnetic energy from nonlinear transmission lines, and more particularly to systems providing the extraction of electromagnetic energy from a nonlinear dielectric-based nonlinear transmission line to an adjacent waveguide via an aperture or series of apertures.

BACKGROUND OF THE INVENTION

Nonlinear transmission line-based systems are known. For example, U.S. Patent Applications 2007/0152875A1, 2009/0051468A1, and U.S. Pat. Nos. 5,319,665, 5,923,227, 7,170, 444, and 7,450,059 derive the majority of their nonlinear properties from nonlinear magnetic materials. U.S. patent application 200410227581A1 describes nonlinear transmission lines that derive the majority of their nonlinear behavior from nonlinear dielectrics. Inventions further described by U.S. Pat. Nos. 5,023,574, 5,804,921, and 6,538,525 utilize discrete packaged circuit elements, such as varactors, to create the nonlinearity of the nonlinear transmission line.

Prior nonlinear transmission line-based systems derive the majority of their nonlinear properties from nonlinear magnetic materials, nonlinear dielectrics, or utilize different energy extraction methods than those addressed by the present invention and fall short in their ability to extract power from nonlinear transmission lines when compared to the present invention. The present invention can provide advantages over the current state of the art including: power extraction can be performed over the entire length of the nonlinear transmission line instead of just at the nonlinear transmission line output terminals, it does not require the formation of soliton-like oscillations in the nonlinear transmission line to generate RF output from the device, output RF is not limited by the cutoff frequency of the nonlinear transmission line, and output RF pulses can be much longer than the input pulse to the nonlinear transmission line.

SUMMARY OF THE INVENTION

It is a feature of the present invention is to provide the ability to extract power from a nonlinear transmission line (NLTL) (e.g., dispersive line or shock line) and generate a time-varying electromagnetic wave in an adjacent waveguide (guided wave structure or antenna).

It is another feature of the present invention to provide the ability to generate and extract electromagnetic energy from a NLTL into an adjacent waveguide at frequencies beyond the cutoff frequencies of the NLTL.

According to one aspect of the present invention, there is provided a NLTL. This NLTL may attribute its nonlinear electromagnetic behavior to a nonlinear dielectric element or series of elements, such as ferroelectric or anti-ferroelectric ceramic slabs, or to a combination of nonlinear magnetic and nonlinear dielectric elements (an example of a nonlinear magnetic element would be a ferromagnetic bead or toroid). When an electromagnetic waveform is injected into the NLTL, the nonlinear properties of the line can form a portion of the waveform into an electromagnetic shock. This shock may or may not be accompanied by a series of soliton-like oscillations, depending on the dispersive properties of the NLTL. Energy contained in the shock and/or soliton-like oscillations can then be extracted from the NLTL via an aperture or a series of apertures. An aperture can be any break in a conductive boundary near to or surrounding the NLTL that allows electromagnetic energy to pass from NLTL to the surrounding area.

According to another aspect of the present invention, the NLTL can be coupled to an adjacent waveguide via an aperture or a series of apertures in the boundary between the NLTL and the waveguide. The adjacent waveguide can contain linear or nonlinear dielectrics, mechanical slow wave structures, or metamaterials to modify the properties of the wave or waves generated by the transfer of energy from the NLTL line via the apertures.

This invention can also provide the following additional advantages over the current state of the art: power extraction can be performed over the entire length of the NLTL instead of just at the NLTL output terminals; the formation of soliton-like oscillations in the NLTL is not necessary to generate RF output from the device, as is required in current devices; the output RF is not limited by the cutoff frequency of the NLTL, as it is current devices; the output RF pulse can be much longer than the input pulse to the NLTL.

These and other features and advantages of the present invention will become more apparent from details disclosed in the following specification where preferred embodiments of the invention are described.

DESCRIPTION OF THE DRAWINGS

For a better understanding of the present invention, and to show how the same may be carried into effect, reference will now be made, by way of example, to the accompanying drawing in which.

DESCRIPTION OF EMBODIMENTS OF THE INVENTION

Figure 1:
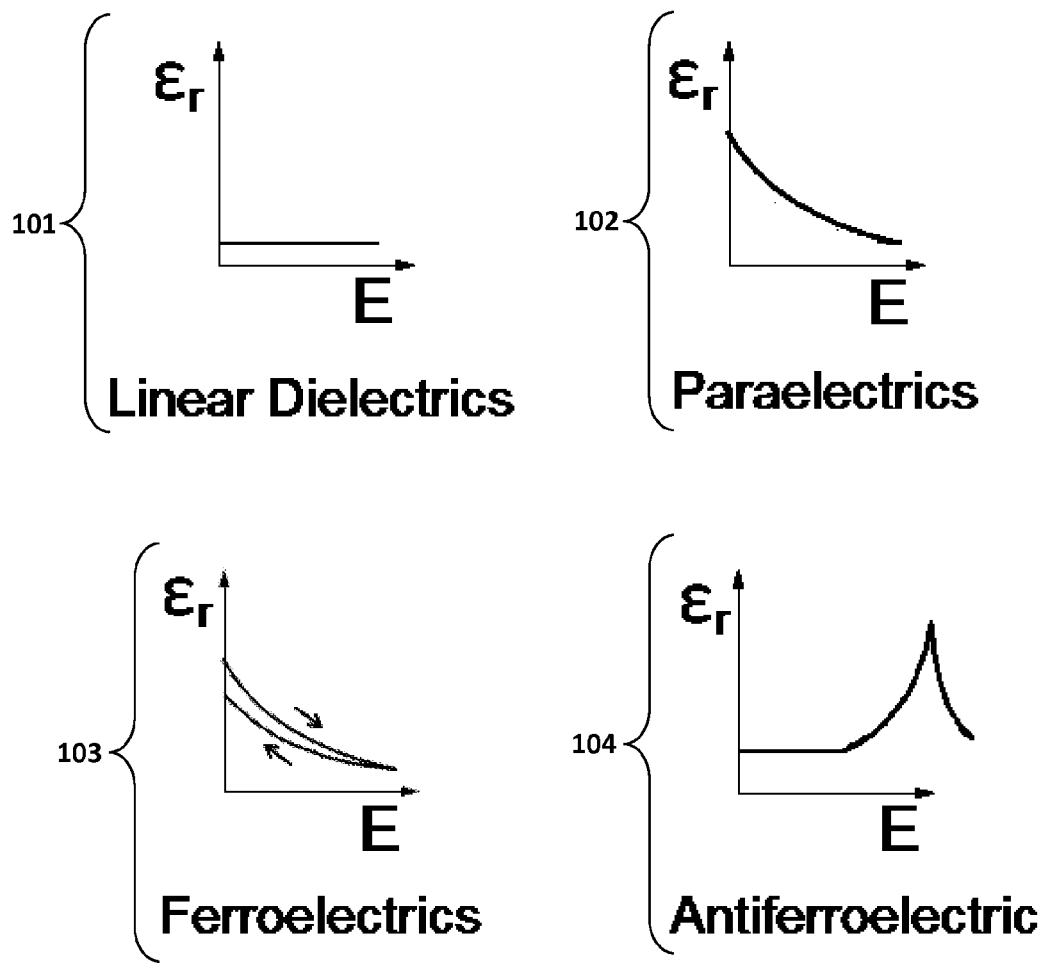
FIG. 1 contains a series of diagramed plots illustrating the electrical behavior of general classes of dielectrics including linear dielectrics, ferroelectrics/paraelectrics, and antiferroelectrics.

Referring to FIG. 1 (labeled as Prior Art), plots illustrating relative permittivity as a function of applied electric field and plots describing relative permittivity as a function of applied electric field are given for four general types of types of dielectrics relevant to the present invention. In linear dielectrics 101, the relative permittivity of the material is independent of the applied electric field. In paraelectrics 102 and ferroelectrics 103, the relative permittivity of the material drops as the applied electric field is increased. The relative permittivity of antiferroelectric materials 104 increases as a function of applied electric field up to a threshold value, after which, increases in electric field cause a reduction in the relative permittivity of the material.

The speed of an electromagnetic wave in a material is given by the formula:

$$v_w = \frac{1}{\sqrt{\epsilon_0 \epsilon_r \mu_0 \mu_r}} = \frac{c}{\sqrt{\epsilon_r \mu_r}}$$

where $v_w$ is the velocity of the electromagnetic wave, c is the speed of light, $\epsilon_0$ and $\mu_0$ are the permittivity and permeability of free space, respectively, $\epsilon_r$ is the relative permittivity of the material and $\mu_r$ is the relative permeability of the material. This relates to the present invention because the nonlinearity of the NLTL is assumed to come primarily from the nonlinear dielectrics. For the purposes of this discussion, $\mu_r$ can be assumed to be constant and close to 1.

Figure 2:
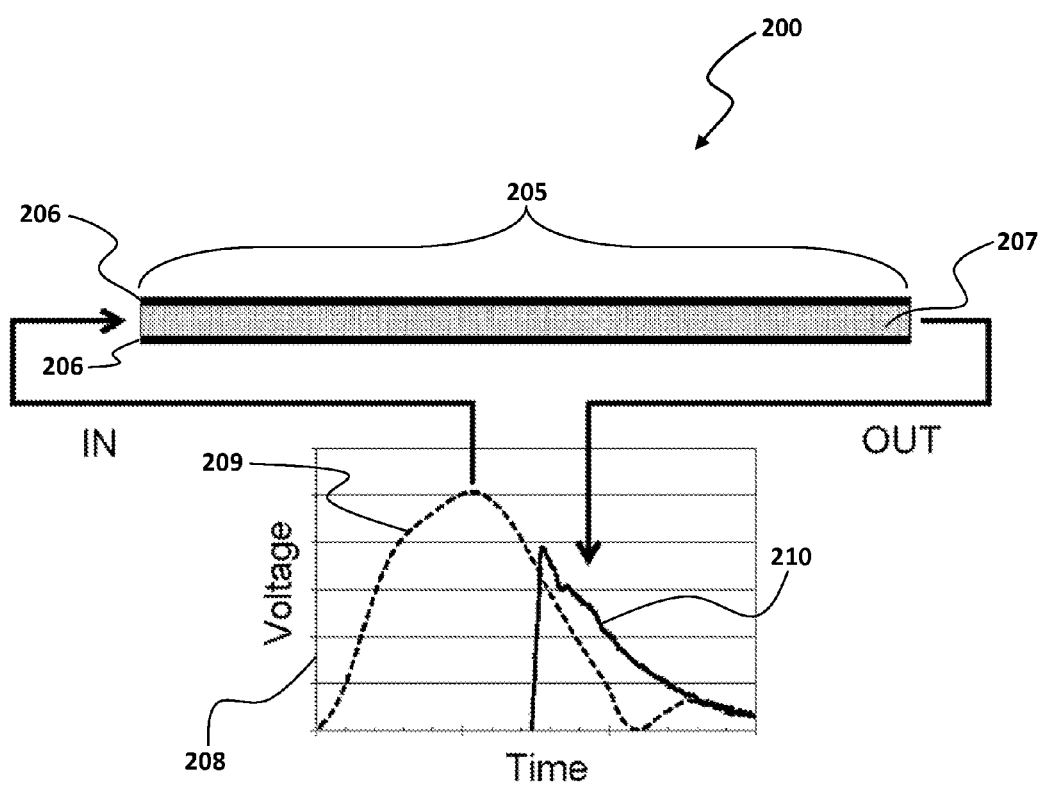
FIG. 2 provides a conceptual drawing of a nonlinear dielectric-based NLTL shock line including a parallel plate waveguide in which the region between the two plates is filled with a nonlinear dielectric (in this case, a paraelectric material), and an associated plot of representative input and output pulses for the shock.

Referring to FIG. 2, a drawing of a NLTL shock line 200 is provided. The NLTL shock line 200 can be formed from a parallel plate waveguide 205, consisting of two metal plates 206 with the region between them filled with a nonlinear dielectric 207. The nonlinear dielectric can be a paraelectric or ferroelectric material. The plot 208 shown in the drawing below the NLTL shock line 200 illustrates how example input and output pulses from the shock line can behave. When the relatively slow rise-time input pulse 209 is injected into the shock line, the higher voltage middle portion results in higher amplitude applied electric field between the plates than exists at the leading and trailing edges of the pulse. Due to the aforementioned electrical properties of the paraelectric or ferroelectric materials, the higher voltage mid-portion of the pulse can travel faster down the line than does the leading or trailing edges of the pulse. The result of this nonlinear process is that electromagnetic energy is concentrated in the leading edge of the voltage pulse as it is distorted into the output pulse 210 having a shock front at the leading edge. In the case that an anti-ferroelectric dielectric was used, the high voltage portion of the input pulse would move more slowly than the leading and trailing edges, thus forming an electromagnetic shock at the trailing edge of the output pulse. It is important to note that the geometry of a NLTL shock line 200 can be more complex than a parallel plate waveguide 205.

Figure 3:
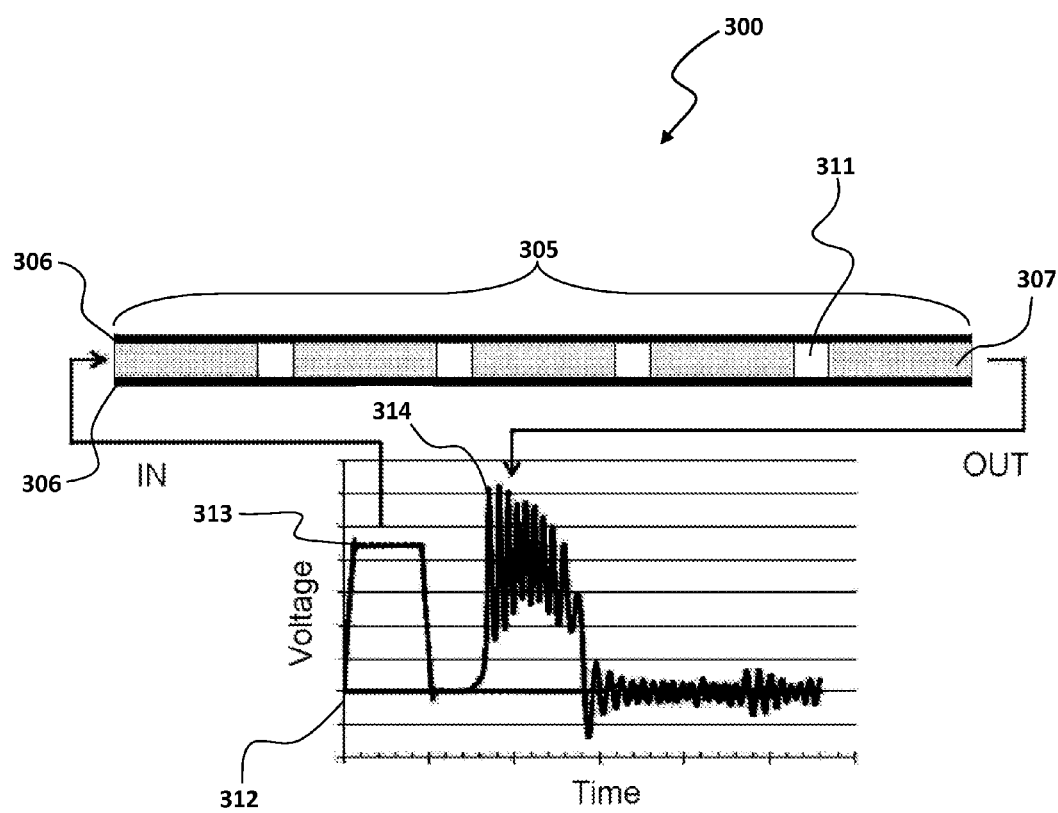
FIG. 3 provides a conceptual drawing of a dispersive nonlinear dielectric-based NLTL including a parallel plate waveguide in which the region between the two plates is filled with a series of alternating regions of a linear dielectric, such as air, and a nonlinear dielectric (in this case, a paraelectric material), and an associated plot representative of input and output pulses for the NLTL.

Referring to FIG. 3, a drawing of a dispersive NLTL 300 is provided. The dispersive NLTL 300 can be formed from a parallel plate waveguide 305 including two metal plates 306 with the region between them filled with a series of alternating regions 311 of a linear dielectric, such as air, and a nonlinear dielectric 307. The nonlinear dielectric can be a paraelectric or ferroelectric material. The included plot 312 illustrates example input and output pulses from the NLTL 300. When the relatively slow rise-time input pulse 313 is injected into the NLTL 300, the higher voltage middle portion results in a higher amplitude applied electric field between the plates 306 than exists at the leading and trailing edges of the pulse. Due to a combination of the aforementioned electrical properties of the paraelectric or ferroelectric materials and the periodic spacing of the linear dielectric sections 311 and nonlinear dielectric sections 307 within the NLTL 300, the input pulse can break up into a series of soliton-like oscillations. These soliton-like oscillations are visible in the output pulse 314. If the nonlinear dielectric sections 307 of this NLTL were to be made of antiferroelectric material, the oscillations could be formed at the trailing edge of the pulse.

Figure 4:
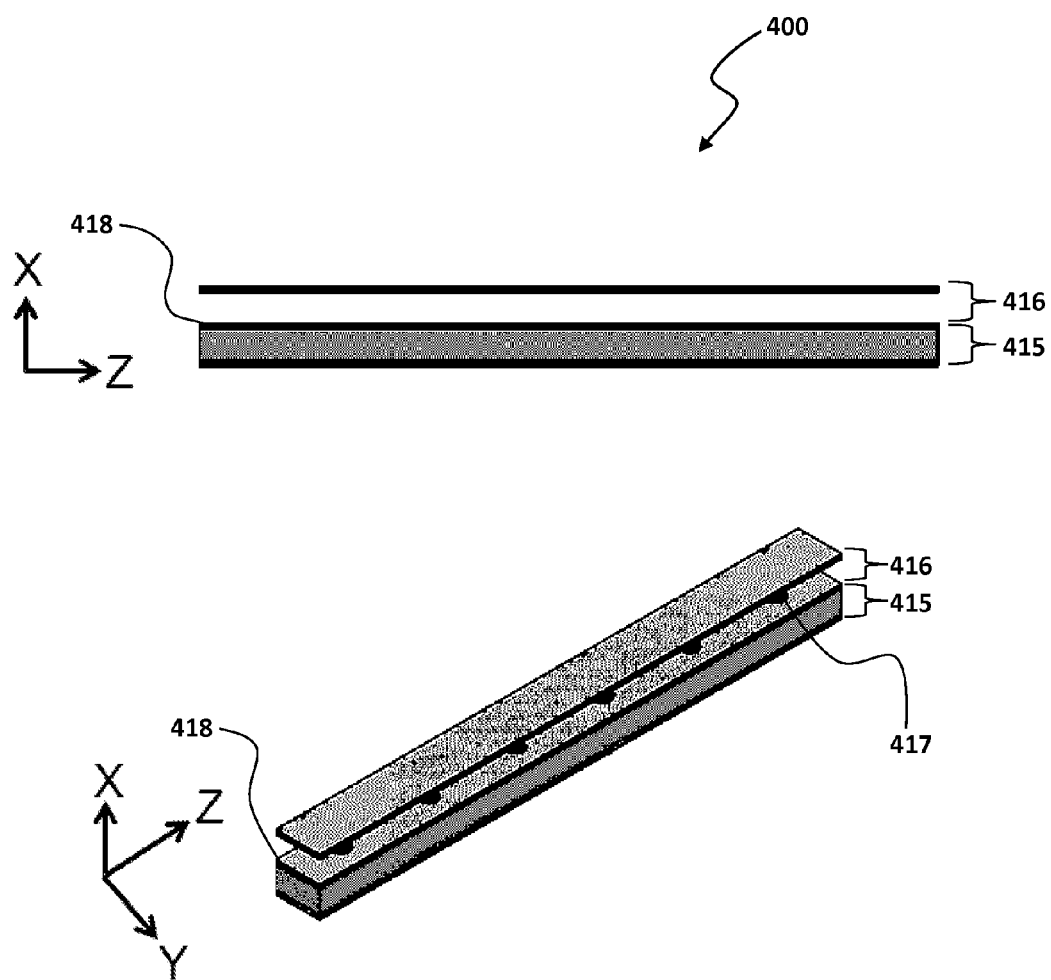
FIG. 4 provides a perspective view of an embodiment of the invention in which the NLTL shock line of FIG. 2 can be coupled to an adjacent waveguide via a series of coupling apertures.

Referring to FIG. 4, a perspective drawing of an NLTL 400 is provided. The NLTL 400 includes a parallel plate shock line 415, similar to the paraelectric NLTL shock line described in FIG. 2, joined to an adjacent waveguide 416, which can be an air-filled parallel plate waveguide as shown in the drawing. The waveguide 416 includes a series of apertures 417 formed in the metal plate 418 that serves as a boundary between the NLTL represented by the plate shock line 415 and the waveguide 416.

Figure 5:
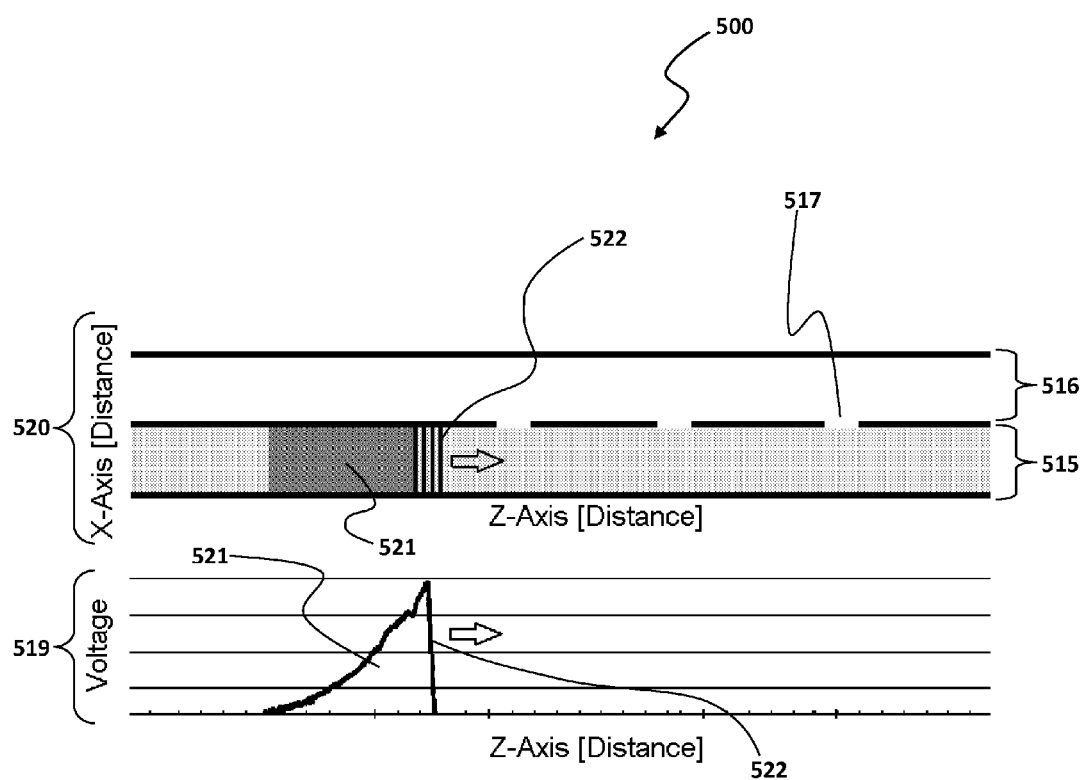
FIG. 5 provides a conceptual plot of an electromagnetic shock traveling through a section of a NLTL shock line containing no apertures.

Referring to FIG. 5, an alternate embodiment for an NLTL 500 is illustrated. FIG. 5 provides a conceptual plot of an electromagnetic shock traveling through a section 521 of a NLTL shock line 515 containing no apertures. As previously described in FIG. 2, and shown in the plot 519 and conceptual drawing 520, as the voltage pulse 521 travels down the NLTL shock line 515, energy is concentrated into an electromagnetic shock 522 at the leading edge of the voltage pulse. The electromagnetic shock front traveling down the NLTL shock line 515 has not yet reached the apertures 517, which will allow energy transfer from the shock to the adjacent waveguide 516.

Figure 6:
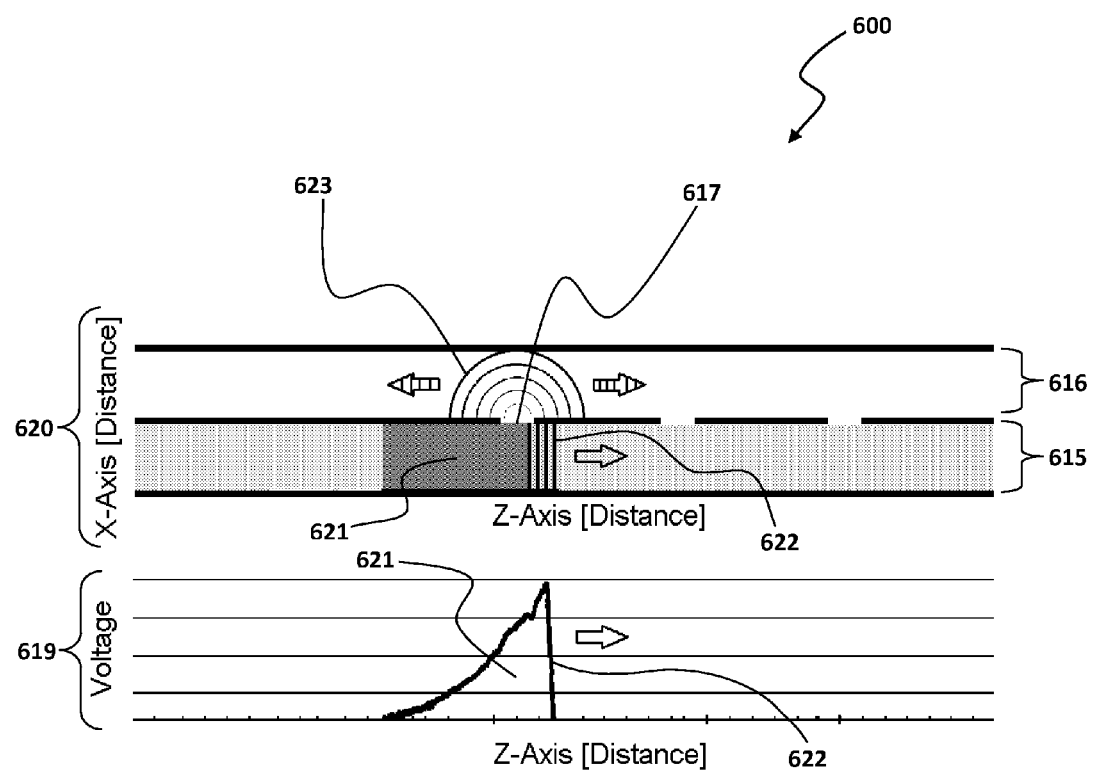
FIG. 6 provides a conceptual plot of an electromagnetic shock traveling through a section of a NLTL shock line containing apertures wherein energy can be transferred from the shock front, through the aperture, into an adjacent waveguide.

FIG. 6 provides an NLTL 600 and a conceptual plot 619 of an electromagnetic shock traveling through a section of a NLTL shock line 515 of the NLTL 600 containing apertures wherein energy can be transferred from the shock front, through the aperture, into an adjacent waveguide. As shown in FIG. 6, the electromagnetic shock front 622 traveling down the NLTL shock line 615 passes an aperture 617 where electromagnetic energy in the form of a wave 623 is radiated into the adjacent guided wave structure 616. Although energy is lost from the electromagnetic shock in the NLTL 600, the nonlinear effects of the NLTL 600 continuously concentrate power from the trailing portion of the voltage pulse 621 into the shock front, thus maintaining it as the shock propagates subsequent apertures. By adjusting the speed of the voltage pulse in the NLTL shock line, the spacing of the apertures, and the dispersion properties of the attached guided wave structure, the electromagnetic waves launched from each subsequent aperture can be combined to form forward and/or backward RF waves within the waveguide, as required by the user. If an antiferroelectric material is used, the electromagnetic shock can form at the back of the voltage pulse, but can also allow extraction of electromagnetic energy in the manner previously described in the paraelectric or ferroelectric case. If a periodic dispersive NLTL is used instead of a shock line, the energy contained in the soliton-like oscillations can be extracted into the adjacent waveguide via the apertures in a manner similar to extraction of energy from a shock front.

It is important to note that the previously presented example describes only very simple embodiments of the present invention. The present invention can encompass any given device geometry wherein energy can be concentrated into an electromagnetic shock by a nonlinear dielectric-based nonlinear transmission line and transferred into an adjacent guided wave structure via an aperture or a series of apertures. The geometry can be planar, as in the given example, coaxial, or more complex. The term "nonlinear dielectric-based nonlinear transmission line" refers to any NLTL that derives the majority of its nonlinear behavior from nonlinear dielectric materials. The adjacent waveguide may be loaded with various structures or materials, such as dielectrics, slow wave structures, and metamaterials; to tailor its dispersive characteristics to meet the needs of the user. If a series of apertures are used to extract power from the electromagnetic shock front into the adjacent waveguide, these apertures can be either periodic or non-periodically spaced.

We claim:

1. A system for extraction of electromagnetic energy from nonlinear transmission line, comprising:
   a nonlinear transmission line deriving nonlinear behavior from a nonlinear dielectric material contained therein, said nonlinear transmission line coupled to a singular adjacent waveguide containing a waveguide material;
   said waveguide material being different from said nonlinear dielectric material; and
   said nonlinear transmission line being for transferring electromagnetic energy having varying phase velocities from said nonlinear transmission line into said adjacent singular waveguide.

2. The system for extraction of electromagnetic energy from a nonlinear transmission line of claim 1, further comprising a plate disposed between said nonlinear transmission line and said adjacent singular waveguide, said plate having at least one aperture formed therein, whereby electromagnetic energy is extracted from said nonlinear transmission line and injected into said adjacent singular waveguide via said at least one aperture.

3. The system for extraction of electromagnetic energy from a nonlinear transmission line of claim 2, wherein:
   said nonlinear dielectric material is comprised of nonlinear electric elements;
   said nonlinear transmission line also contains linear dielectric elements; and
   the nonlinear dielectric elements further comprise a non-periodic array interspersed with said linear dielectric elements.

4. The system for extraction of electromagnetic energy from a nonlinear transmission line of claim 2, wherein:
   said nonlinear dielectric material is comprised of nonlinear dielectric elements;
   said nonlinear transmission line also contains linear dielectric elements; and
   said nonlinear dielectric elements further comprise a periodic array interspersed with said linear dielectric elements.

5. The system for extraction of electromagnetic energy from a nonlinear transmission line of claim 2, wherein said at least one aperture is a plurality of apertures that are periodically spaced.

6. The system for extraction of electromagnetic energy from a nonlinear transmission line of claim 2, wherein said waveguide material is selected from a group consisting of: a nonlinear magnetic material, a dielectric material, a nonlinear dielectric material, a slow wave structure, and a metamaterial.

7. The system for extraction of electromagnetic energy from a nonlinear transmission line of claim 1, wherein said waveguide material is selected from a group consisting of: a nonlinear magnetic material, a dielectric material, a nonlinear dielectric material, a slow wave structure, and a metamaterial.

8. The system for extraction of electromagnetic energy from a nonlinear transmission line of claim 1, wherein said nonlinear transmission line is a shock line.

9. The system for extraction of electromagnetic energy from a nonlinear transmission line of claim 1, wherein:
   said nonlinear dielectric material is comprised of nonlinear dielectric elements;
   said nonlinear transmission line also contains linear dielectric elements; and
   said nonlinear dielectric elements further comprise a periodic array interspersed with said linear dielectric elements.

10. The system for extraction of electromagnetic energy from a nonlinear transmission line of claim 1, wherein:
    said nonlinear dielectric material is comprised of nonlinear electric elements;
    said nonlinear transmission line also contains linear dielectric elements; and
    said nonlinear elements further comprise a non-periodic array interspersed with said linear dielectric elements.

11. A system for extraction of electromagnetic energy from a nonlinear dielectric-based nonlinear transmission line, comprising:
    a nonlinear transmission line containing at least one non-linear dielectric material;
    the nonlinear transmission line being coupled to a singular adjacent waveguide via a common wall having at least one aperture;
    the singular adjacent waveguide containing at least one waveguide material;
    at least one of the at least one waveguide material being different from at least one of the at least one nonlinear dielectric material; and
    the nonlinear transmission line being for transferring electromagnetic energy having varying phase velocities from the nonlinear transmission line into the singular adjacent waveguide via the at least one aperture.

12. The system for extraction of electromagnetic energy from a nonlinear dielectric-based nonlinear transmission line of claim 11, wherein the system is frequency-tunable by changing a peak voltage of an input pulse to the nonlinear dielectric-based nonlinear transmission line, thereby changing velocity of an electromagnetic shock front in the nonlinear dielectric-based nonlinear transmission line.

13. The system for extraction of electromagnetic energy from a nonlinear transmission line of claim 11, wherein the at least one waveguide material is selected from a group consisting of: a nonlinear magnetic material, a dielectric material, a nonlinear dielectric material, a slow wave structure, and a metamaterial.

14. The system for extraction of electromagnetic energy from a nonlinear transmission line of claim 11, wherein the nonlinear transmission line is a shock line.

15. The system for extraction of electromagnetic ene from, a nonlinear transmission line of claim 11, wherein:
    the at least one linear dielectric material is comprised of discrete linear dielectric elements; and
    the at least one nonlinear dielectric material is comprised of discrete nonlinear dielectric elements that further comprise a periodic array interspersed with the linear dielectric elements along a longitudinal axis.

16. The system for extraction of electromagnetic energy from a nonlinear transmission line of claim 11, wherein:
    the at least one linear dielectric material is comprised of discrete linear dielectric elements; and
    the at least one nonlinear dielectric material is comprised of discrete nonlinear dielectric elements that further comprise a non-periodic array interspersed with the linear dielectric elements along a longitudinal axis.

17. An apparatus for extracting electromagnetic energy from a nonlinear transmission line, comprising:
- a nonlinear transmission line having a longitudinal axis being generally parallel to a direction of propagation for an electromagnetic pulse introduced into the nonlinear transmission line;
- a singular waveguide lying adjacent to the nonlinear transmission line;
- the singular waveguide and the nonlinear transmission line having a common lateral wall;
- an aperture in the wall communicating the singular waveguide and the nonlinear transmission line;
- the nonlinear transmission line containing a linear dielectric material and also containing a nonlinear dielectric material;
- the linear and nonlinear dielectric materials filling separate linear and nonlinear dielectric regions in the nonlinear transmission line, respectively, with each of the linear and nonlinear dielectric regions having a longitudinal length along the longitudinal axis and a lateral width orthogonal to the longitudinal axis; and
- the linear and nonlinear dielectric regions alternating along the longitudinal axis, whereby
- the electromagnetic pulse introduced into the nonlinear transmission line is broken up into a series of soliton-like oscillations and electromagnetic energy radiates from the aperture into the singular waveguide.

18. An electromagnetic energy extraction apparatus as defined in claim 17, wherein the waveguide contains a waveguide material which is different from either the linear dielectric material or the nonlinear dielectric material.

19. An electromagnetic energy extraction apparatus as defined in claim 18, wherein the waveguide material is selected from a group consisting of a second linear dielectric material, a second nonlinear dielectric material, a nonlinear magnetic material, a mechanical slow wave structure, and a metamaterial.

20. An electromagnetic energy extraction apparatus as defined in claim 17, wherein the linear dielectric regions are longitudinally interspersed with the nonlinear dielectric regions and are periodically located along the longitudinal axis.

21. An electromagnetic energy extraction apparatus as defined in claim 17, wherein the aperture is a plurality of apertures that are periodically spaced apart from one another.

22. A system for extraction of electromagnetic energy from a nonlinear transmission line, comprising:
- a nonlinear transmission line
    - deriving nonlinear behavior from a nonlinear dielectric material contained therein,
    - being coupled to a singular adjacent waveguide containing a waveguide material, and
    - being for receiving an electromagnetic pulse; and
- the waveguide material being different from the nonlinear dielectric material, whereby
- electromagnetic energy is extracted from the nonlinear transmission line by the adjacent singular waveguide.

23. A system for extraction of electromagnetic energy from a nonlinear dielectric-based nonlinear transmission line, comprising:
- a nonlinear transmission line
    - containing at least one nonlinear dielectric material;
    - being coupled to a singular adjacent waveguide via a common wall having at least one aperture, and
    - being for receiving an electromagnetic pulse;
- the singular adjacent waveguide containing at least one waveguide material; and
- at least one of the at least one waveguide material being different from at least one of the at least one nonlinear dielectric material, whereby
- electromagnetic energy is extracted from the nonlinear transmission line by the singular adjacent waveguide via the at least one aperture.

* * * * *